(12) United States Patent
Lu et al.

(10) Patent No.: US 8,773,791 B1
(45) Date of Patent: Jul. 8, 2014

(54) SYSTEMS AND METHODS FOR X-SAMPLE BASED NOISE CANCELLATION

(71) Applicant: LSI Corporation, San Jose, CA (US)

(72) Inventors: Lu Lu, San Jose, CA (US); Haitao Xia, San Jose, CA (US); Rui Cao, Milpitas, CA (US)

(73) Assignee: LSI Corporation, San Jose, CA (US)

( * ) Notice: Subject to any disclaimer, the term of this patent is extended or adjusted under 35 U.S.C. 154(b) by 0 days.

(21) Appl. No.: 13/741,003

(22) Filed: Jan. 14, 2013

(51) Int. Cl.
*G11B 20/10* (2006.01)

(52) U.S. Cl.
USPC .............................................. 360/39

(58) Field of Classification Search
None
See application file for complete search history.

(56) References Cited

U.S. PATENT DOCUMENTS

| | | | |
|---|---|---|---|
| 4,242,704 A * | 12/1980 | Ito et al. | 348/620 |
| 5,278,703 A | 1/1994 | Rub et al. | |
| 5,278,846 A | 1/1994 | Okayama | |
| 5,317,472 A | 5/1994 | Schweitzer, III | |
| 5,325,402 A | 6/1994 | Ushirokawa | |
| 5,392,299 A | 2/1995 | Rhines | |
| 5,417,500 A | 5/1995 | Martinie | |
| 5,513,192 A | 4/1996 | Janku | |
| 5,523,903 A | 6/1996 | Hetzler | |
| 5,550,810 A | 8/1996 | Monogioudis et al. | |
| 5,550,870 A | 8/1996 | Blaker | |
| 5,612,964 A | 3/1997 | Haraszti | |
| 5,710,784 A | 1/1998 | Kindred | |
| 5,717,706 A | 2/1998 | Ikeda | |
| 5,802,118 A | 9/1998 | Bliss | |
| 5,844,945 A | 12/1998 | Nam | |
| 5,898,710 A | 4/1999 | Amrany | |
| 5,923,713 A | 7/1999 | Hatakeyama | |
| 5,978,414 A | 11/1999 | Nara | |
| 5,983,383 A | 11/1999 | Wolf | |
| 6,005,897 A | 12/1999 | Mccalissister | |
| 6,023,783 A | 2/2000 | Divsalar | |
| 6,029,264 A | 2/2000 | Kobayashi | |
| 6,065,149 A | 5/2000 | Yamanaka | |
| 6,097,764 A | 8/2000 | McCallister | |
| 6,130,793 A * | 10/2000 | Ohmori et al. | 360/46 |
| 6,145,110 A | 11/2000 | Khayrallah | |
| 6,216,249 B1 | 4/2001 | Bliss | |
| 6,216,251 B1 | 4/2001 | McGinn | |
| 6,266,795 B1 | 7/2001 | Wei | |
| 6,317,472 B1 | 11/2001 | Choi | |
| 6,351,832 B1 | 2/2002 | Wei | |
| 6,377,610 B1 | 4/2002 | Hagenauer | |
| 6,381,726 B1 | 4/2002 | Weng | |
| 6,473,878 B1 | 10/2002 | Wei | |
| 6,535,553 B1 | 3/2003 | Limberg | |
| 6,625,775 B1 | 9/2003 | Kim | |
| 6,748,034 B2 | 6/2004 | Hattori | |
| 6,757,862 B1 | 6/2004 | Marianetti, II | |
| 6,785,863 B2 | 8/2004 | Blankenship | |
| 6,810,502 B2 | 10/2004 | Eidson | |

(Continued)

OTHER PUBLICATIONS

Axvig et al., "Average Min-Sum Decoding of LDPC Codes", 5th International Symposium on Turbo Codes and Related Topics (2008).

(Continued)

*Primary Examiner* — Thang Tran
(74) *Attorney, Agent, or Firm* — Hamilton DeSanctis & Cha

(57) ABSTRACT

Systems, methods, devices, circuits for data processing, and more particularly to cancelling noise while processing data.

20 Claims, 5 Drawing Sheets

(56) References Cited

U.S. PATENT DOCUMENTS

| | | | |
|---|---|---|---|
| 6,970,511 | B1 | 11/2005 | Barnette |
| 6,986,098 | B2 | 1/2006 | Poeppelman |
| 7,047,474 | B2 | 5/2006 | Rhee |
| 7,058,873 | B2 | 6/2006 | Song |
| 7,073,118 | B2 | 7/2006 | Greenberg |
| 7,093,179 | B2 | 8/2006 | Shea |
| 7,117,427 | B2 | 10/2006 | Ophir |
| 7,133,228 | B2 | 11/2006 | Fung |
| 7,184,486 | B1 | 2/2007 | Wu |
| 7,191,378 | B2 | 3/2007 | Eroz |
| 7,203,887 | B2 | 4/2007 | Eroz |
| 7,308,061 | B1 | 12/2007 | Huang |
| 7,310,768 | B2 | 12/2007 | Eidson |
| 7,313,750 | B1 | 12/2007 | Feng |
| 7,370,258 | B2 | 5/2008 | Iancu |
| 7,415,651 | B2 | 8/2008 | Argon |
| 7,502,189 | B2 | 3/2009 | Sawaguchi |
| 7,523,375 | B2 | 4/2009 | Spencer |
| 7,587,657 | B2 | 9/2009 | Haratsch |
| 7,590,168 | B2 | 9/2009 | Raghavan |
| 7,646,829 | B2 | 1/2010 | Ashley |
| 7,702,986 | B2 | 4/2010 | Bjerke |
| 7,752,523 | B1 | 7/2010 | Chaichanavong |
| 7,779,325 | B2 | 8/2010 | Song |
| 7,802,172 | B2 | 9/2010 | Vila Casado et al. |
| 7,952,824 | B2 | 5/2011 | Dziak |
| 7,958,425 | B2 | 6/2011 | Chugg |
| 7,996,746 | B2 | 8/2011 | Livshitz |
| 8,018,360 | B2 | 9/2011 | Nayak |
| 8,201,051 | B2 | 6/2012 | Tan |
| 8,237,597 | B2 | 8/2012 | Liu |
| 8,261,171 | B2 | 9/2012 | Annampedu |
| 8,291,284 | B2 | 10/2012 | Savin |
| 8,295,001 | B2 | 10/2012 | Liu |
| 2008/0013858 | A1* | 1/2008 | Hohda et al. ............... 382/275 |
| 2008/0069373 | A1 | 3/2008 | Jiang |
| 2008/0304558 | A1 | 12/2008 | Zhu |
| 2009/0132893 | A1 | 5/2009 | Miyazaki |
| 2009/0185643 | A1 | 7/2009 | Fitzpatrick |
| 2010/0067621 | A1* | 3/2010 | Noeldner et al. ............. 375/341 |
| 2010/0067628 | A1* | 3/2010 | Buehner et al. ............... 375/346 |
| 2011/0167227 | A1 | 7/2011 | Yang |
| 2011/0264987 | A1 | 10/2011 | Li |
| 2012/0124118 | A1 | 5/2012 | Ivkovic |
| 2012/0182643 | A1 | 7/2012 | Zhang |
| 2012/0207201 | A1 | 8/2012 | Xia |
| 2012/0212849 | A1 | 8/2012 | Xu |
| 2012/0262814 | A1 | 10/2012 | Li |
| 2012/0265488 | A1 | 10/2012 | Sun |
| 2013/0177163 | A1* | 7/2013 | Hsiao ........................ 381/71.1 |

OTHER PUBLICATIONS

Bahl et al., "Optimal decoding of linear codes for minimizing symbol error rate", IEEE Trans. Inform. Theory, vol. 20, pp. 284-287 (Mar. 1974).

Blaum, "High-Rate Modulation Codes for Reverse Concatenation", IEEE Transactions on Magnetics, vol. 43, No. 2 (Feb. 2007).

Casado et al., Multiple-rate low- density parity-check codes with constant blocklength, IEEE Transations on communications, Jan. 2009, vol. 57, pp. 75-83.

Cui et al., "High-Throughput Layered LDPC Decoding Architecture", IEEE Transactions on Very Large Scale Integration (VLSI) Systems, vol. 17, No. 4 (Apr. 2009).

Fair et al., "Guided scrambling: a new line coding technique for high bit rate fiber optic transmission systems", IEEE Trans. Commun., vol. 39, pp. 289-297 (Feb. 1991).

Fan et al., "Constrained coding techniques for soft iterative decoders" Proc. IEEE Global Telecommun. Conf., vol. 1b, pp. 631-637 (1999).

Fossorier, Marc P.C. "Quasi-Cyclic Low-Density Parity-Check Codes From Circulant Permutation Maricies" IEEE Transactions on Information Theory, vol. 50, No. 8 Aug. 8, 2004.

Gross, "Stochastic Decoding of LDPC Codes over GF(q)", HDPCC Workshop, Tel Aviv (Mar. 2, 2010).

Gunnam et al., "VLSI Architectures for Layered Decoding for Irregular LDPC Codes of WiMax", IEEE ICC Proceedings (2007).

Hagenauer, J. et al A Viterbi Algorithm with Soft-Decision Outputs and its Applications in Proc. IEEE Globecom, pp. 47. 11-47 Dallas, TX Nov. 1989.

Han and Ryan, "Pinning Techniques for Low-Floor Detection/Decoding of LDPC-Coded Partial Response Channels", 5th International Symposium on Turbo Codes &Related Topics, 2008.

Jin et al., "Design Techniques for Weakly Constrained Codes", IEEE Trans Commun. vol. 51, No. 5, pp. 709-714 (May 2003).

Kautz, "Fibonacci Codes for Synchronization Control", IEEE Trans. Info. Theory, vol. 11, No. 2, pp. 284-292 (Apr. 1965).

Kschischang et al., "Factor Graphs and the Sum-Product Algorithm", IEEE Transactions on Information Theory, vol. 47, No. 2 (Feb. 2001).

Leduc-Primeau et al., "A Relaxed Half-Stochastic Iterative Decoder for LDPC Codes", IEEE Communications Society, IEEE Globecom proceedings (2009).

Lee et al., "Partial Zero-Forcing Adaptive MMSE Receiver for DS-CDMA Uplink in Multicell Environments" IEEE Transactions on Vehicular Tech. vol. 51, No. 5, Sep. 2002.

Li et al "Efficient Encoding of Quasi-Cyclic Low-Density Parity Check Codes" IEEE Transactions on Communications on 53 (11) 1973-1973, 2005.

Lim et al. "Convergence Analysis of Constrained Joint Adaptation in Recording Channels" IEEE Trans. on Signal Processing vol. 54, No. 1 Jan. 2006.

Lin et al "An efficient VLSI Architecture for non binary LDPC decoders"—IEEE Transaction on Circuits and Systems II vol. 57, Issue 1 (Jan. 2010) pp. 51-55.

Moon et al, "Pattern-dependent noise prediction in signal-dependent Noise," IEEE JSAC, vol. 19, No. 4 pp. 730-743, Apr. 2001.

Moon et al., "Maximum transition run codes for data storage systems", IEEE Trans. Magn., vol. 32, No. 5, pp. 3992-3994 (Sep. 1996).

Shokrollahi "LDPC Codes: An Introduction", Digital Fountain, Inc. (Apr. 2, 2003).

Spagnol et al, "Hardware Implementation of GF(2m) LDPC Decoders", IEEE Transactions on Circuits and Systemssi: Regular Papers, vol. 56, No. 12 (Dec. 2009).

Tehrani et al., "Fully Parallel Stochastic LDPC Decoders", IEEE Transactions on Signal Processing, vol. 56, No. 11 (Nov. 2008).

Todd et al., "Enforcing maximum-transition-run code constraints and low-density parity check decoding", IEEE Trans. Magn., vol. 40, No. 6, pp. 3566-3571 (Nov. 2004).

U.S. Appl. No. 13/227,544, Unpublished, filed Sep. 8, 2011, Shaohua Yang.

U.S. Appl. No. 13/239,683, Unpublished, filed Sep. 22, 2011, Changyou Xu.

U.S. Appl. No. 13/113,219, Unpublished, filed May 23, 2011, Yang Han.

U.S. Appl. No. 13/227,416, Unpublished, filed Sep. 7, 2011, Lei Chen.

U.S. Appl. No. 13/213,751, Unpublished, filed Aug. 19, 2011, Fan Zhang.

U.S. Appl. No. 13/296,022, Unpublished, filed Nov. 14, 2011, Victor Krachkovsky.

U.S. Appl. No. 13/174,537, Unpublished, filed Jun. 30, 2011, Anantha Raman Krishnan.

U.S. Appl. No. 13/180,495, Unpublished, filed Jul. 11, 2011, Chung-Li Wang.

U.S. Appl. No. 13/171,615, Unpublished, filed Jun. 29, 2011, Bradley D. Seago.

U.S. Appl. No. 13/269,832, Unpublished, filed Oct. 10, 2011, Haitao Xia.

U.S. Appl. No. 13/186,234, Unpublished, filed Jul. 19, 2011, Haitao Xia.

U.S. Appl. No. 13/174,453, Unpublished, filed Jun. 30, 2011, Johnson Yen.

U.S. Appl. No. 13/363,751, Unpublished, filed Feb. 1, 2012, Lei Chen.

U.S. Appl. No. 13/445,878, Unpublished, filed Apr. 12, 2012, Yu Liao.

U.S. Appl. No. 13/433,693, Unpublished, filed Mar. 29, 2012, Fan Zhang.

(56) References Cited

OTHER PUBLICATIONS

U.S. Appl. No. 13/621,341, Unpublished, filed Sep. 17, 2012, Shaohua Yang.
U.S. Appl. No. 13/670,393, Unpublished, filed Nov. 6, 2012, Lei Chen.
U.S. Appl. No. 13/283,549, Unpublished, filed Oct. 27, 2011, Wu Chang.
U.S. Appl. No. 13/622,294, Unpublished, filed Sep. 18, 2012, Fan Zhang.
U.S. Appl. No. 13/989,583, Unpublished, filed Oct. 15, 2012, Shaohua Yang.
U.S. Appl. No. 13/372,580, Unpublished, filed Feb. 14, 2012, Fan Zhang.
U.S. Appl. No. 13/474,660, Unpublished, filed May 17, 2012, Zongwang Li.
U.S. Appl. No. 13/422,986, Unpublished, filed Mar. 16, 2012, Fan Zhang.
U.S. Appl. No. 13/445,834, Unpublished, filed Apr. 12, 2012, Chung-Li Wang.
U.S. Appl. No. 13/545,833, Unpublished, filed Jul. 10, 2012, Zhi Bin Li.
U.S. Appl. No. 13/596,819, Unpublished, filed Aug. 28, 2012, Shaohua Yang.
U.S. Appl. No. 13/596,947, Unpublished, filed Aug. 28, 2012, Fan Zhang.
U.S. Appl. No. 13/596,978, Unpublished, filed Aug. 28, 2012, Fan Zhang.
U.S. Appl. No. 13/597,001, Unpublished, filed Aug. 28, 2012, Fan Zhang.
U.S. Appl. No. 13/619,907, Unpublished, filed Sep. 14, 2012, Fan Zhang.
U.S. Appl. No. 13/597,026, Unpublished, filed Aug. 28, 2012, Fan Zhang.
U.S. Appl. No. 13/340,974, Unpublished, filed Dec. 30, 2011, Dan Liu.
U.S. Appl. No. 13/300,078, Unpublished, filed Nov. 18, 2011, Chung-Li Wang.
U.S. Appl. No. 13/295,150, Unpublished, filed Nov. 14, 2011, Zongwang Li.
U.S. Appl. No. 13/305,510, Unpublished, filed Nov. 28, 2011, Lei Chen.
U.S. Appl. No. 13/369,468, Unpublished, filed Feb. 9, 2012, Zongwang Li.
U.S. Appl. No. 13/340,951, Unpublished, filed Dec. 30, 2011, Lei Chen.
U.S. Appl. No. 13/284,767, Unpublished, filed Oct. 28, 2011, Fan Zhang.
U.S. Appl. No. 13/305,551, Unpublished, filed Nov. 28, 2011, Yang Han.
U.S. Appl. No. 13/302,119, Unpublished, filed Nov. 22, 2011, Lei Chen.
U.S. Appl. No. 13/269,852, Unpublished, filed Oct. 10, 2011, Haitao Xia.
U.S. Appl. No. 13/327,279, Unpublished, filed Dec. 15, 2011, Wei Feng.
U.S. Appl. No. 13/316,741, Unpublished, filed Dec. 12, 2011, Yang Han.
U.S. Appl. No. 13/316,858, Unpublished, filed Dec. 12, 2011, Zongwang Li.
U.S. Appl. No. 13/362,409, Unpublished, filed Jan. 31, 2012, Fan Zhang.
U.S. Appl. No. 13/445,848, Unpublished, filed Apr. 12, 2012, Bruce Wilson.
U.S. Appl. No. 13/412,520, Unpublished, filed Mar. 5, 2012, Fan Zhang.
U.S. Appl. No. 13/284,730, Unpublished, filed Oct. 28, 2011, Fan Zhang.
U.S. Appl. No. 13/426,714, Unpublished, filed Mar. 22, 2012, Shaohua Yang.
Vasic, B., "High-Rate Girth-Eight Codes on Rectangular Integer Lattices", IEEE Trans. Communications, vol. 52, Aug. 2004, pp. 1248-1252.
Vasic, B., "High-Rate Low-Density Parity-Check Codes Based on Anti-Pasch Affine Geometries," Proc ICC 2002, pp. 1332-1336.
Weon-Cheol Lee et al., "Vitierbi Decoding Method Using Channel State Info. in CPFDM System" IEEE Trans. on Consumer Elect., IEEE Service Center, NY, NY vol. 45, No. 3 Aug. 1999.
Yeo et al., "VLSI Architecture for Iterative Decoders in Magnetic Storage Channels", Mar. 2001, pp. 748-755, IEEE trans. Magnetics, vol. 37, No. 2.
Zhang et al., "Analysis of Verification-Based Decoding on the q-ary Symmetric Channel for Large q", IEEE Trans. on Information Theory, vol. 57, No. 10 (Oct. 2011).
Zhong et al., "Design of VLSI Implementation-Oriented LDPC Codes", IEEE, pp. 670-673, 2003.
Zhong et al., "High-Rate Quasi-Cyclic LDPC Codes for Magnetic Recording Channel with Low Error Floor", ISCAS, IEEE pp. 3546-3549, May 2006.
Zhong et al., "Quasi Cyclic LDPC Codes for the Magnetic Recording Channel: Code Design and VSLI Implementation", IEEE Transactions on Magnetics, v. 43, pp. 1118-1123, Mar. 2007.
Zhong et al., "Joint Code-Encoder Design for LDPC Coding System VLSI Implementation", ISCAS, IEEE pp. 389-392, May 2004.
Zhong, "Block-LDPC: A Practical LDPC Coding System Design Approach", IEEE Trans. on Circuits, Regular Papers, vol. 5, No. 4, pp. 766-775, Apr. 2005.

* cited by examiner

SYSTEMS AND METHODS FOR X-SAMPLE BASED NOISE CANCELLATION

FIELD OF THE INVENTION

Various embodiments of the present invention provide systems and methods for data processing, and more particularly to systems and methods for cancelling noise in a data processing system.

BACKGROUND

Various data processing systems have been developed including storage systems, cellular telephone systems, and radio transmission systems. In such systems data is transferred from a sender to a receiver via some medium. For example, in a storage system, data is sent from a sender (i.e., a write function) to a receiver (i.e., a read function) via a storage medium. As information is stored and transmitted in the form of digital data, errors are introduced that, if not corrected, can corrupt the data and render the information unusable. The effectiveness of any transfer is impacted by any losses in data caused by various factors. Many types of error correction systems have been developed to detect and correct errors in digital data, encoding the data in the sender and decoding in the receiver to recover the originally written data. DC noise in the received data impedes data decoding.

SUMMARY

Various embodiments of the present invention provide systems and methods for data processing, and more particularly to systems and methods for cancelling noise in a data processing system.

A data processing system is disclosed including an analog to digital converter circuit, a sample based noise cancellation circuit, and an equalizer circuit. The analog to digital converter circuit is operable to convert an input signal into a series of corresponding digital samples. The sample based noise cancellation circuit is operable to calculate a noise component based at least in part on the series of digital samples and to subtract the noise component from the series of digital samples to yield a noise corrected output. The equalizer circuit is operable to equalize the noise corrected output to yield an equalized output.

This summary provides only a general outline of some embodiments of the invention. The phrases "in one embodiment," "according to one embodiment," "in various embodiments", "in one or more embodiments", "in particular embodiments" and the like generally mean the particular feature, structure, or characteristic following the phrase is included in at least one embodiment of the present invention, and may be included in more than one embodiment of the present invention. Importantly, such phrases do not necessarily refer to the same embodiment. This summary provides only a general outline of some embodiments of the invention. Additional embodiments are disclosed in the following detailed description, the appended claims and the accompanying drawings.

BRIEF DESCRIPTION OF THE FIGURES

A further understanding of the various embodiments of the present invention may be realized by reference to the figures which are described in remaining portions of the specification. In the figures, like reference numerals may be used throughout several drawings to refer to similar components.

In the figures, like reference numerals are used throughout several figures to refer to similar components.

DETAILED DESCRIPTION OF THE INVENTION

Various embodiments of the present invention provide systems and methods for data processing, and more particularly to systems and methods for cancelling noise in a data processing system.

Various embodiments of the present invention provide data processing systems. The data processing systems include an X sample based noise cancellation circuit, and a processing circuit. The X sample based noise cancellation circuit is operable to remove direct current (DC) noise in X samples to yield a noise corrected output, and the processing circuit is operable to apply a data processing algorithm to the noise corrected output to determine correct values of the X samples. As used herein, the term "X sample" corresponds to a data sample derived from the output of an analog to digital converter circuit prior to equalization. In contrast, the term "Y sample" corresponds to a data sample derived from an X sample after equalization.

By cancelling noise at the X-sample level, the noise correction occurs prior to the equalization and thus is operable to enable the equalizer to provide an equalized output that is not affected by the DC noise, improving low frequency equalization. In contrast, if noise correction is performed after equalization, the equalizer will attempt to remove DC noise itself, attenuating the low frequency portion of the true signal. Where there is DC noise in the X samples, the X sample based noise cancellation circuit will subtract the average errors from the X samples, improving the equalizer performance as well as the overall system. This reduces miss-equalization to improve equalizer adaptation performance and shorten the convergence time of the equalizer. Based upon the disclosure provided herein, one of ordinary skill in the art will recognize a variety of opportunities that may be achieved through use of various embodiments of the present invention.

In some instances of the aforementioned embodiments, the processing circuit includes a data detector circuit and a data decoder circuit. The data detector circuit is operable to apply a data detection algorithm to the equalized output to yield a detected output, and the data decoder circuit operable to apply a data decoding algorithm to a decoder input derived from the detected output to yield the data output. In one or more cases, the data decoder circuit is a low density parity check decoder circuit. In various cases, the data detector circuit is a maximum a posteriori data detector circuit. In other cases, the data detector circuit is a Viterbi algorithm data detector circuit.

Figure 1:
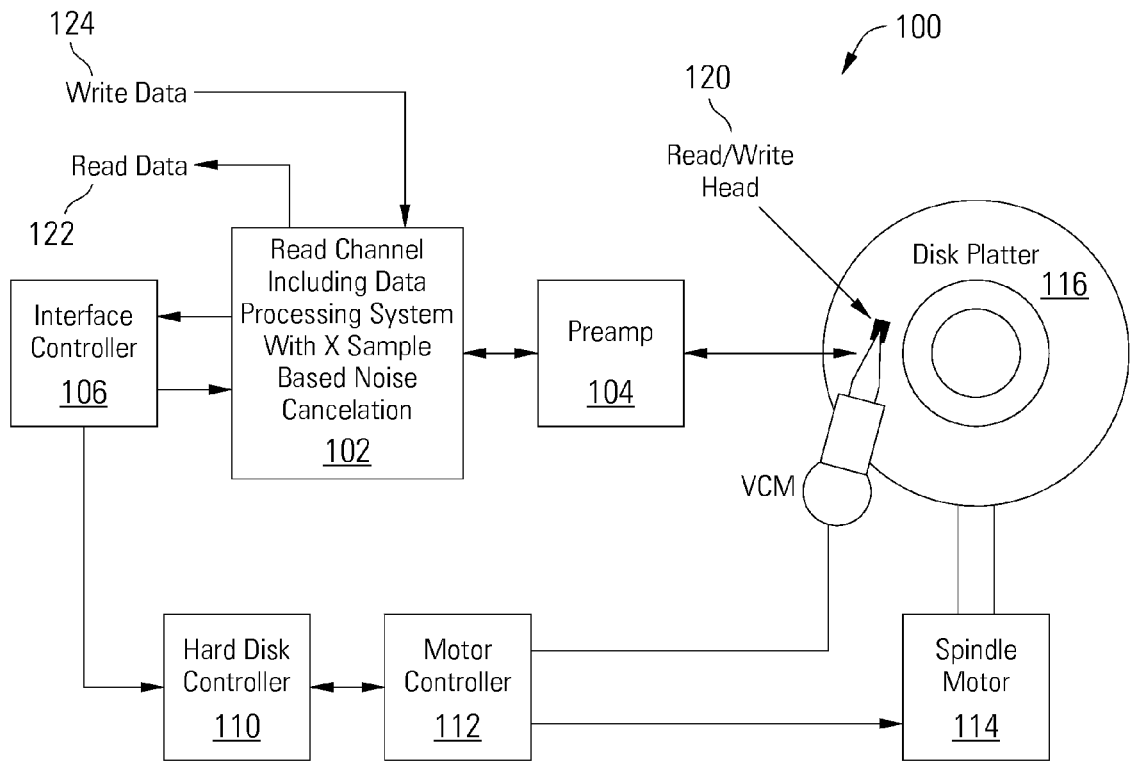
FIG. 1 shows a storage system including X sample based noise cancellation circuitry in accordance with various embodiments of the present invention.
Figure 2:
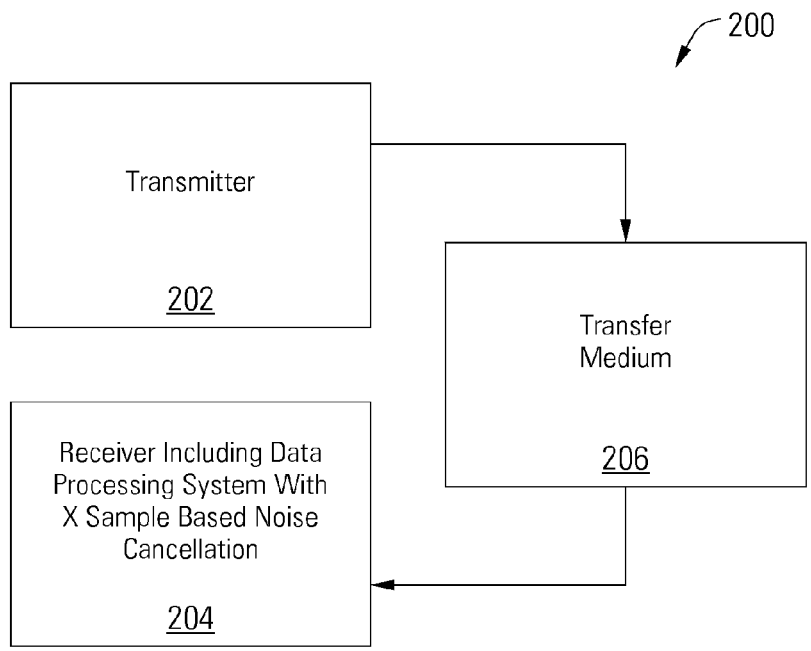
FIG. 2 depicts a data transmission system including X sample based noise cancellation circuitry in accordance with one or more embodiments of the present invention.

Although the data processing system with X sample based noise cancellation disclosed herein is not limited to any particular application, several examples of applications are presented in FIGS. 1 and 2 that benefit from embodiments of the present invention. Turning to FIG. 1, a storage system 100 is illustrated as an example application of a data processing system with X sample based noise cancellation in accordance with some embodiments of the present invention. The storage system 100 includes a read channel circuit 102 with a data processing system with out of order transfer in accordance with some embodiments of the present inventions. Storage system 100 may be, for example, a hard disk drive. Storage system 100 also includes a preamplifier 104, an interface controller 106, a hard disk controller 110, a motor controller 112, a spindle motor 114, a disk platter 116, and a read/write head assembly 120. Interface controller 106 controls addressing and timing of data to/from disk platter 116. The data on disk platter 116 consists of groups of magnetic signals that may be detected by read/write head assembly 120 when the assembly is properly positioned over disk platter 116. In one embodiment, disk platter 116 includes magnetic signals recorded in accordance with either a longitudinal or a perpendicular recording scheme.

In a typical read operation, read/write head assembly 120 is accurately positioned by motor controller 112 over a desired data track on disk platter 116. Motor controller 112 both positions read/write head assembly 120 in relation to disk platter 116 and drives spindle motor 114 by moving read/write head assembly 120 to the proper data track on disk platter 116 under the direction of hard disk controller 110. Spindle motor 114 spins disk platter 116 at a determined spin rate (RPMs). Once read/write head assembly 120 is positioned adjacent the proper data track, magnetic signals representing data on disk platter 116 are sensed by read/write head assembly 120 as disk platter 116 is rotated by spindle motor 114. The sensed magnetic signals are provided as a continuous, minute analog signal representative of the magnetic data on disk platter 116. This minute analog signal is transferred from read/write head assembly 120 to read channel circuit 102 via preamplifier 104. Preamplifier 104 is operable to amplify the minute analog signals accessed from disk platter 116. In turn, read channel circuit 102 decodes and digitizes the received analog signal to recreate the information originally written to disk platter 116. This data is provided as read data 122 to a receiving circuit. While processing the read data, read channel circuit 102 processes the received signal using a data processing system with X sample based noise cancellation. Such a data processing system with X sample based noise cancellation may be implemented consistent with that disclosed below in relation to FIG. 3. In some cases, the data processing may be performed consistent with the flow diagram disclosed below in relation to FIGS. 4A and 4B. A write operation is substantially the opposite of the preceding read operation with write data 124 being provided to read channel circuit 102. This data is then encoded and written to disk platter 116.

It should be noted that storage system 100 may be integrated into a larger storage system such as, for example, a RAID (redundant array of inexpensive disks or redundant array of independent disks) based storage system. Such a RAID storage system increases stability and reliability through redundancy, combining multiple disks as a logical unit. Data may be spread across a number of disks included in the RAID storage system according to a variety of algorithms and accessed by an operating system as if it were a single disk. For example, data may be mirrored to multiple disks in the RAID storage system, or may be sliced and distributed across multiple disks in a number of techniques. If a small number of disks in the RAID storage system fail or become unavailable, error correction techniques may be used to recreate the missing data based on the remaining portions of the data from the other disks in the RAID storage system. The disks in the RAID storage system may be, but are not limited to, individual storage systems such storage system 100, and may be located in close proximity to each other or distributed more widely for increased security. In a write operation, write data is provided to a controller, which stores the write data across the disks, for example by mirroring or by striping the write data. In a read operation, the controller retrieves the data from the disks. The controller then yields the resulting read data as if the RAID storage system were a single disk.

A data decoder circuit used in relation to read channel circuit 102 may be, but is not limited to, a low density parity check (LDPC) decoder circuit as are known in the art. Such low density parity check technology is applicable to transmission of information over virtually any channel or storage of information on virtually any media. Transmission applications include, but are not limited to, optical fiber, radio frequency channels, wired or wireless local area networks, digital subscriber line technologies, wireless cellular, Ethernet over any medium such as copper or optical fiber, cable channels such as cable television, and Earth-satellite communications. Storage applications include, but are not limited to, hard disk drives, compact disks, digital video disks, magnetic tapes and memory devices such as DRAM, NAND flash, NOR flash, other non-volatile memories and solid state drives.

In addition, it should be noted that storage system 100 may be modified to include solid state memory that is used to store data in addition to the storage offered by disk platter 116. This solid state memory may be used in parallel to disk platter 116 to provide additional storage. In such a case, the solid state memory receives and provides information directly to read channel circuit 102. Alternatively, the solid state memory may be used as a cache where it offers faster access time than that offered by disk platted 116. In such a case, the solid state memory may be disposed between interface controller 106 and read channel circuit 102 where it operates as a pass through to disk platter 116 when requested data is not available in the solid state memory or when the solid state memory does not have sufficient storage to hold a newly written data set. Based upon the disclosure provided herein, one of ordinary skill in the art will recognize a variety of storage systems including both disk platter 116 and a solid state memory.

Turning to FIG. 2, a wireless communication system 200 or data transmission device including a receiver 204 with a data processing system with X sample based noise cancellation is shown in accordance with some embodiments of the present inventions. Communication system 200 includes a transmitter 202 that is operable to transmit encoded information via a transfer medium 206 as is known in the art. The encoded data is received from transfer medium 206 by receiver 204. Receiver 204 incorporates a data processing system with X sample based noise cancellation. Such a data processing system with X sample based noise cancellation may be implemented consistent with that described below in relation to FIG. 3. In some cases, the data processing may be done consistent with the flow diagram discussed below in relation to FIGS. 4A and 4B.

Figure 3:
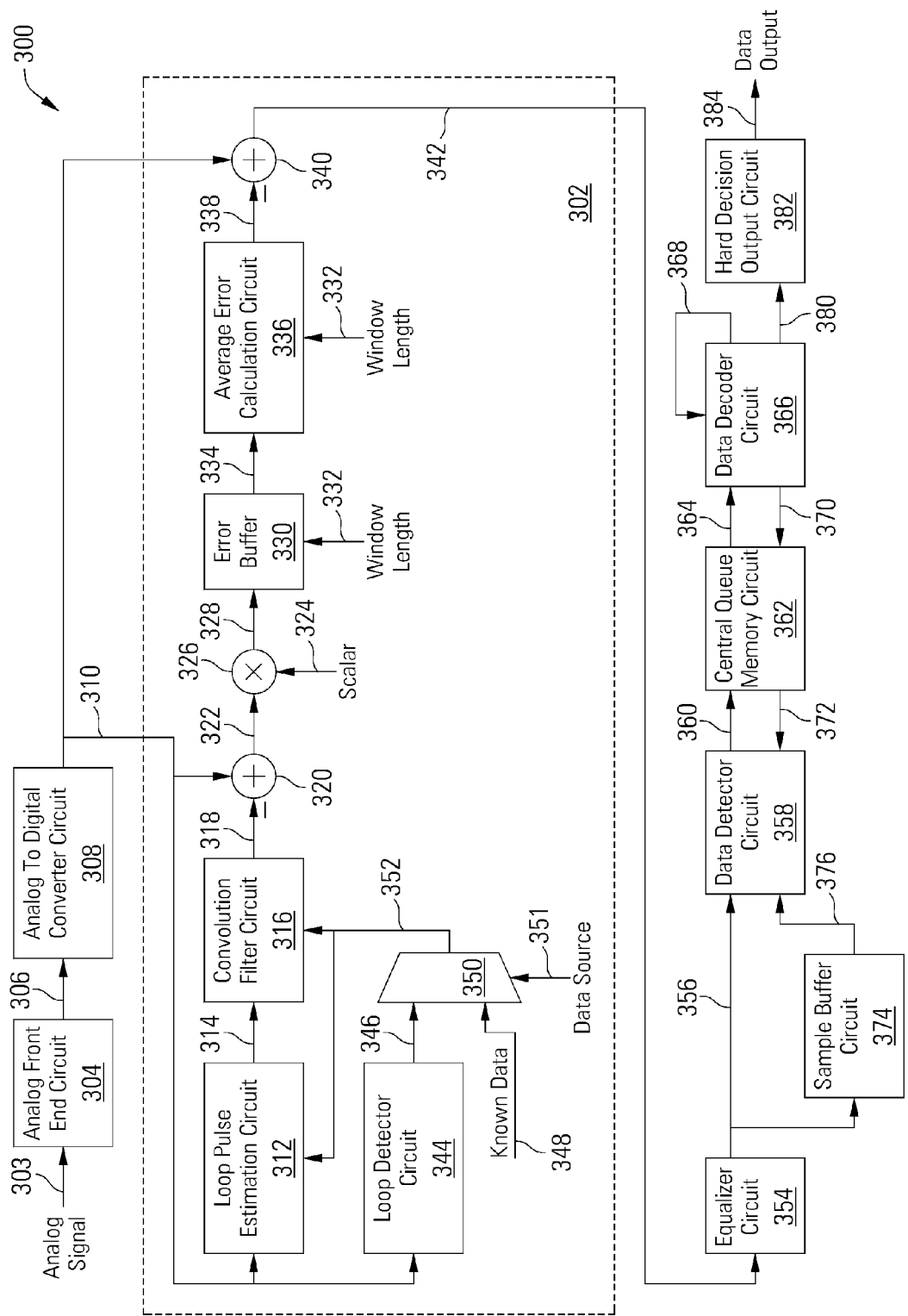
FIG. 3 shows a data processing circuit including an X sample based noise cancellation circuit in accordance with some embodiments of the present invention.

FIG. 3 depicts a data processing circuit 300 including an X sample based noise cancellation circuit 302 in accordance with some embodiments of the present invention. Data processing circuit 300 includes an analog front end circuit 304 that receives an analog signal 303. Analog front end circuit 304 processes analog signal 303 and provides a processed analog signal 306 to an analog to digital converter circuit 308. Analog front end circuit 308 may include, but is not limited to, an analog filter and an amplifier circuit as are known in the art. Based upon the disclosure provided herein, one of ordinary skill in the art will recognize a variety of circuitry that may be included as part of analog front end circuit 308. In some cases, analog input signal 303 is derived from a read/write head assembly (not shown) that is disposed in relation to a storage medium (not shown). In other cases, analog signal 303 is derived from a receiver circuit (not shown) that is operable to receive a signal from a transmission medium (not shown). The transmission medium may be wired or wireless. Based upon the disclosure provided herein, one of ordinary skill in the art will recognize a variety of source from which analog signal 303 may be derived.

Analog to digital converter circuit 308 converts processed analog signal 306 into a corresponding series of digital samples 310. Digital samples 310 (and signals derived there from) prior to being processed by an equalizer circuit 354 are considered X samples. Analog to digital converter circuit 308 may be any circuit known in the art that is capable of producing digital samples corresponding to an analog input signal. Based upon the disclosure provided herein, one of ordinary skill in the art will recognize a variety of analog to digital converter circuits that may be used in relation to different embodiments of the present invention. Digital samples 308 are provided to X sample based noise cancellation circuit 302 that calculates an average noise component 338 and subtracts the average noise component 338 from digital samples 310 using a summation circuit 340 to yield a noise corrected output 342.

X sample based noise cancellation circuit 302 additionally includes a loop pulse estimation circuit 312, a convolution filter circuit 316, a summation circuit 320, a multiplier circuit 326, an error buffer 330, an average error calculation circuit 336, a loop detector circuit 344, and a selector circuit 350. In operation, convolution filter circuit 316 receives a detected output 352 from a selector circuit 350. Selector circuit 350 provides one of a known data source 348 or a detected output 346 from a loop detector circuit 344 as detected output 352 based upon a data source 351 selector. In particular, where data source 351 is asserted high, known data 348 is provided by selector circuit 350 as detected output 352. Alternatively, where data source 351 is asserted low, detected output 352 is provided by selector circuit 350 as detected output 352. Loop detector circuit 344 may be any circuit known in the art that applies some type of algorithm designed to return a representation of the data from which analog signal 303 was derived, based on the digital samples 310. In one particular embodiment of the present invention, loop detector circuit 344 is operable to determine timing feedback and other operations designed to align the sampling of analog to digital converter circuit 308 with the received data set, and/or to adjust a gain applied by analog front end circuit 304. Based upon the disclosure provided herein, one of ordinary skill in the art will recognize a variety of circuits capable of providing a representation of the data from which analog signal 303 was derived that may be used in relation to different embodiments of the present invention. Where detected output 346 is derived from detected output 378, it is a representation of the X samples represented by digital samples 310 and thus the data from which analog signal 303 was derived. Detected output 352 may also comprise known data 348 used to calibrate the data processing circuit 300, with the analog signal 303 also corresponding to the known data 348.

The loop pulse estimation circuit 312 also receives digital samples 310 (or X samples) and detected output 352 and yields an X target 314, a partial response target based on the digital samples 310 and on actual values 352 of the digital samples 310. Loop pulse estimation circuit 312 may be any circuit known in the art that is capable of processing digital samples 310 and corresponding actual values 352 to derive a partial response target. Based upon the disclosure provided herein, one of ordinary skill in the art will recognize a variety of loop pulse estimation circuits that may be used in relation to different embodiments of the present invention.

Convolution filter circuit 316 may be any circuit known in the art that is capable of applying target based filtering to an input signal to yield an output conformed to a target. In this case, convolution filter circuit 316 applies target filtering to detected output 352 to yield a target filtered output 318, using the X target 314 from loop pulse estimation circuit 312. In some embodiments, the convolution filter circuit 316 convolves the X target 314 with either the detected output 346 from loop detector circuit 344 or with known data 348 to yield the target filtered output 318. Target filtered output 318 is an X ideal, an ideal approximation of digital samples 310.

Target filtered output 318 is provided to summation circuit 320 where it is subtracted from digital samples 310 to yield a sum 322 which is provided to multiplier circuit 326.

Multiplier circuit 326 multiplies sum 322 by a scalar 324 to yield a noise component 328. In some cases, scalar 324 is programmable, while in other cases it is fixed. The scalar 324 enables the X sample based noise cancellation circuit 302 to be adjusted, either increasing the scalar 324 to increase the strength of the noise reduction in noisy channel conditions or reducing the scalar 324 to reduce degradation of system performance when the channel conditions are less noisy. The scalar 324 is static in some embodiments, and is dynamically adjusted in other embodiments to respond to channel noise conditions.

Noise component 328 represents noise derived from digital samples 310 (i.e., noise derived from X-samples) at a particular time. The noise component 328 is accumulated in an error buffer 330, with the number of noise component values stored in error buffer 330 determined by a window length 332 that specifies the length of a sliding window over which noise component values are averaged. Error buffer 330 may be any circuit known in the art that is capable of temporarily storing noise component values, such as but not limited to a first-in first-out memory. In some embodiments, window length 332 is programmable, while in other cases it is fixed.

Buffered noise component values 334 from the error buffer 330 are provided to an average error calculation circuit 336 which calculates an average noise component 338 over the length of the sliding window whose length is specified by window length 332. Given a window length 332 of L, average noise component 338 is calculated in some embodiments according to Equation 1:

$$\frac{(\text{error}(0) + \text{error}(1) + \ldots \text{error}(L-1))}{L} \quad (\text{Eq 1})$$

Based upon the disclosure provided herein, one of ordinary skill in the art will recognize a variety of circuits that may be used to calculate the average error in relation to different embodiments of the present invention. Average noise component 338 is subtracted from digital samples 310 in summation circuit 340 to yield noise corrected output 342 as the output of X sample based noise cancellation circuit 302.

Noise corrected output 342 is provided to an equalizer circuit 354. Equalizer circuit 354 applies an equalization algorithm to noise corrected output 342 to yield an equalized output 356. In some embodiments of the present invention, equalizer circuit 354 is a digital finite impulse response filter circuit as are known in the art. Equalized output 356 is stored to a sample buffer circuit 374 that includes sufficient memory to maintain one or more codewords until processing of that codeword is completed through a data detector circuit 358 and a data decoder circuit 366 including, where warranted, multiple "global iterations" defined as passes through both data detector circuit 358 and data decoder circuit 366 and/or "local iterations" defined as passes through data decoding circuit 366 during a given global iteration. Sample buffer circuit 374 stores the received data as buffered data 376.

Data detector circuit 358 is a data detector circuit capable of producing a detected output 360 by applying a data detection algorithm to a data input. In some embodiments, the data detection algorithm may be but is not limited to, a Viterbi algorithm detection algorithm or a maximum a posteriori detection algorithm as are known in the art. Based upon the disclosure provided herein, one of ordinary skill in the art will recognize a variety of data detection algorithms that may be used in relation to different embodiments of the present invention. Data detector circuit 358 may provide both hard decisions and soft decisions. The terms "hard decisions" and "soft decisions" are used in their broadest sense. In particular, "hard decisions" are outputs indicating an expected original input value (e.g., a binary '1' or '0', or a non-binary digital value), and the "soft decisions" indicate a likelihood that corresponding hard decisions are correct. Based upon the disclosure provided herein, one of ordinary skill in the art will recognize a variety of hard decisions and soft decisions that may be used in relation to different embodiments of the present invention.

Detected output 360 is provided to a central queue memory circuit 362 that operates to buffer data passed between data detector circuit 358 and data decoder circuit 366. When data decoder circuit 366 is available, data decoder circuit 366 receives detected output 360 from central queue memory 362 as a decoder input 364. Data decoder circuit 366 applies a data decoding algorithm to decoder input 364 in an attempt to recover originally written data. The result of the data decoding algorithm is provided as a decoded output 370. Similar to detected output 360, decoded output 370 may include both hard decisions and soft decisions. Data decoder circuit 366 may be any data decoder circuit known in the art that is capable of applying a decoding algorithm to a received input. Data decoder circuit 366 may be, but is not limited to, a low density parity check decoder circuit or a Reed Solomon decoder circuit as are known in the art. Based upon the disclosure provided herein, one of ordinary skill in the art will recognize a variety of data decoder circuits that may be used in relation to different embodiments of the present invention. Where the original data is recovered (i.e., the data decoding algorithm converges) or a timeout condition occurs, data decoder circuit 366 provides the result of the data decoding algorithm as a data output 380. Data output 380 is provided to a hard decision output circuit 382 where the data is reordered before providing a series of ordered data sets as a data output 384.

One or more iterations through the combination of data detector circuit 358 and data decoder circuit 366 may be made in an effort to converge on the originally written data set. As mentioned above, processing through both the data detector circuit and the data decoder circuit is referred to as a "global iteration". For the first global iteration, data detector circuit 358 applies the data detection algorithm without guidance from a decoded output. For subsequent global iterations, data detector circuit 358 applies the data detection algorithm to buffered data 376 as guided by decoded output 370. Decoded output 370 is received from central queue memory 362 as a detector input 372.

During each global iteration it is possible for data decoder circuit 366 to make one or more local iterations including application of the data decoding algorithm to decoder input 364. For the first local iteration, data decoder circuit 366 applies the data decoder algorithm without guidance from a decoded output 368. For subsequent local iterations, data decoder circuit 366 applies the data decoding algorithm to decoder input 364 as guided by a previous decoded output 368. In some embodiments of the present invention, a default of ten local iterations is allowed for each global iteration.

Figure 4A:
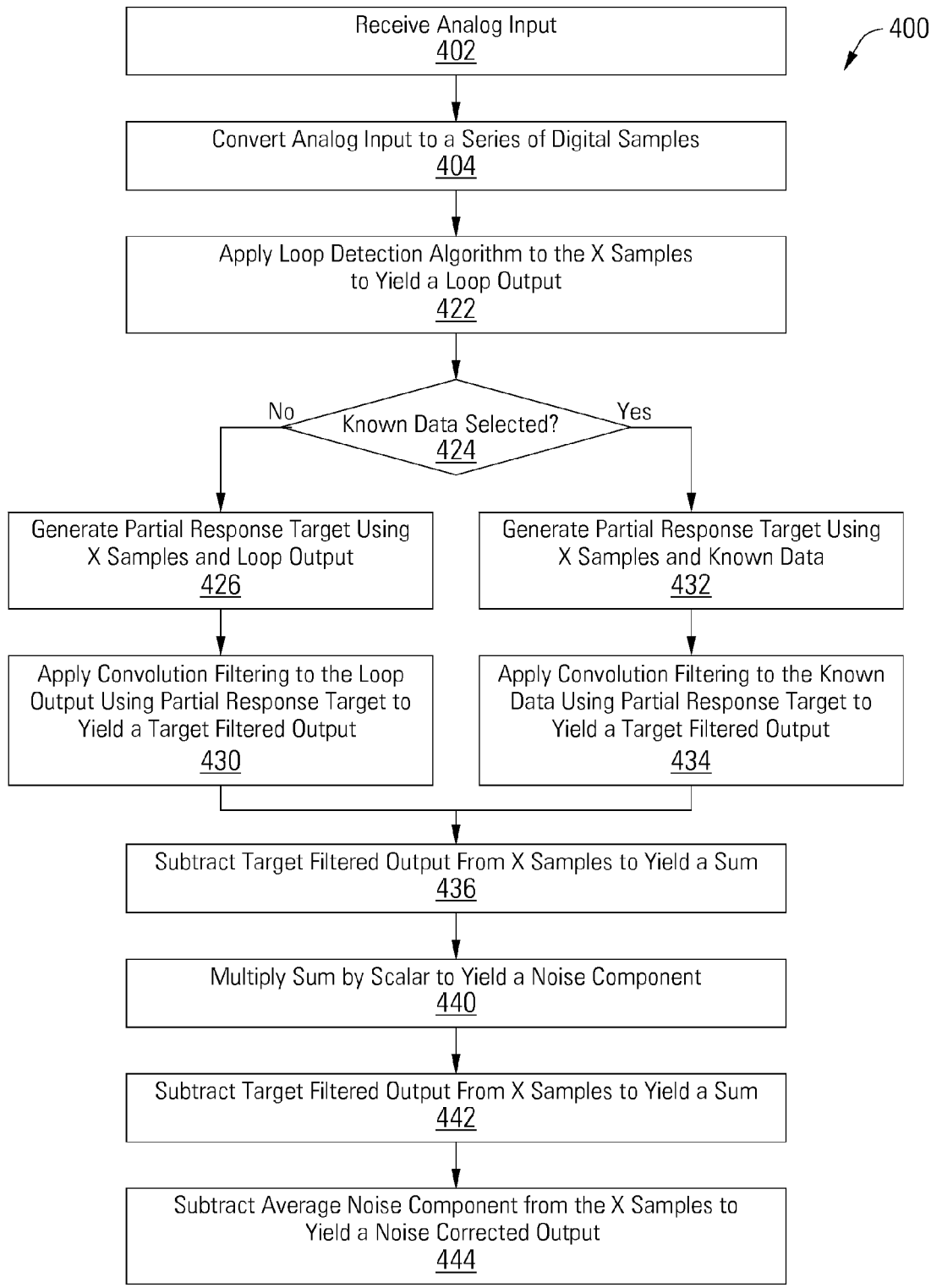
FIGS. 4a-4c are flow diagrams showing a method for data processing relying on X sample based noise cancellation in accordance with some embodiments of the present invention.
Figure 4B:
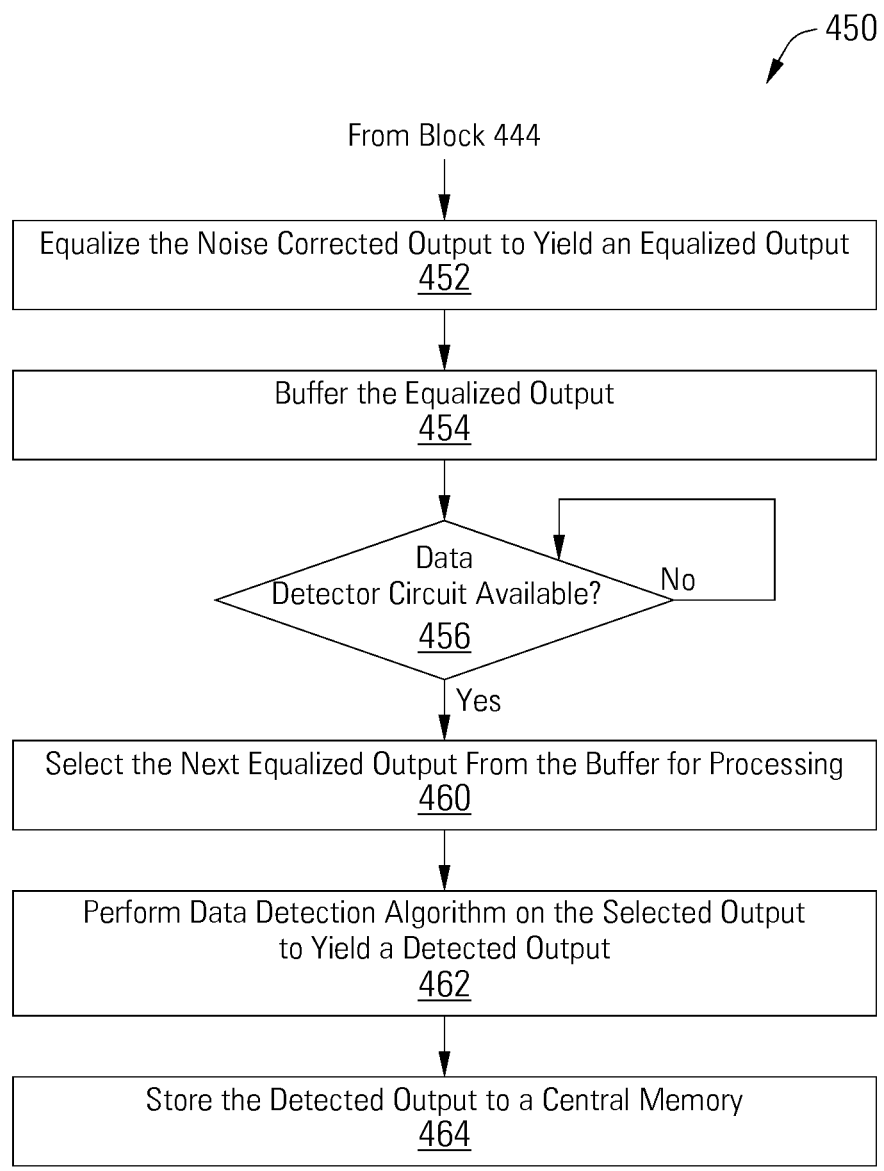
Figure 4C:
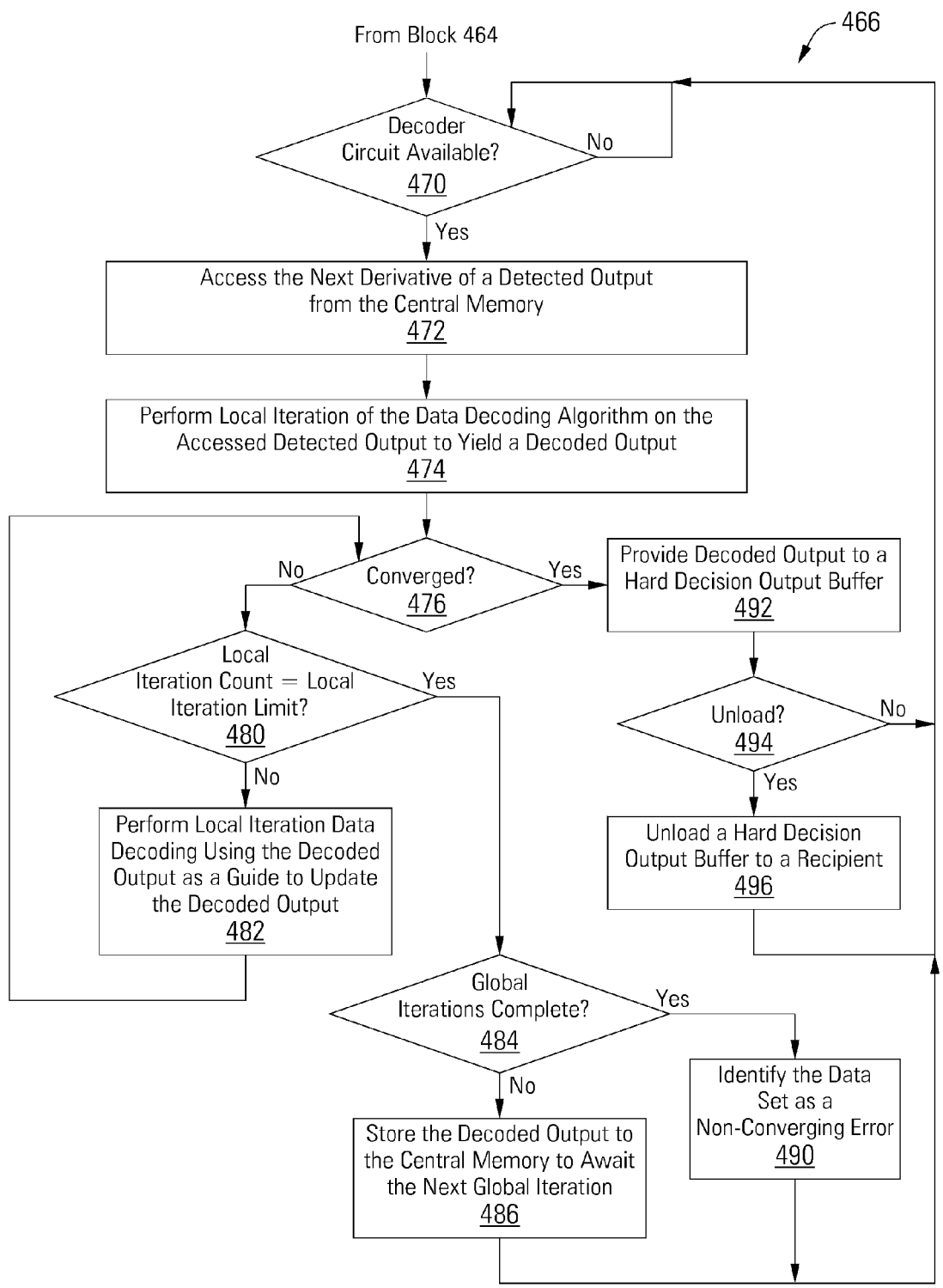

Turning to FIGS. 4a-4c are flow diagrams 400, 450, 466 showing a method for data processing relying on X sample based noise correction in accordance with some embodiments of the present invention. Following flow diagram 400 of FIG. 4a, an analog input is received (block 402). The analog input may be derived from, for example, a storage medium or a data transmission channel. Based upon the disclosure provided herein, one of ordinary skill in the art will recognize a variety of sources of the analog input. The analog input is converted to a series of digital X samples (block 404). This conversion may be done using an analog to digital converter circuit or system as are known in the art. Of note, any circuit known in the art that is capable of converting an analog signal into a series of digital values representing the received analog signal may be used.

A loop detection algorithm is applied to the X samples to yield a loop output (block 422). The loop detection algorithm may be applied by any circuit known in the art that applies some type of algorithm designed to return a representation of the data from which the analog input was derived. Loop detection may be performed using any type of algorithm designed to return a representation of the data from which the source analog signal for the X samples was derived, based on the X samples. In some embodiments, the loop detection is performed using a Viterbi detection algorithm. In some embodiments, the loop detection is performed using a maximum a posteriori detection algorithm. In some embodiments of the present invention, the loop detection algorithm is operable to determine timing feedback and other operations designed to align the sampling related to the analog to digital conversion, and/or to adjust a gain applied by an analog front end circuit. Based upon the disclosure provided herein, one of ordinary skill in the art will recognize a variety of loop detection algorithms capable of providing a representation of the data from which the analog input was derived that may be used in relation to different embodiments of the present invention. A determination is made as to whether known data is selected in place of the loop output (block 424). If the loop output is selected (block 424), a partial response target is generated based on the X samples and the loop output (block 426), and a convolution filtering is applied to the loop output using the partial response target to yield a target filtered output (block 430). If known data is selected (block 424), a partial response target is generated based on the X samples and the known data (block 432), and a convolution filtering is applied to the known data using the partial response target to yield a target filtered output (block 434).

The target filtered output is subtracted from the X samples to yield a sum (block 436). The sum is multiplied by a scalar to yield a noise component (block 440). In some cases, the scalar value is programmable, while in other cases it is fixed. The scalar value enables the X sample based noise cancellation to be adjusted, either increasing the scalar value to increase the strength of the noise reduction in noisy channel conditions or reducing the scalar value to reduce degradation of system performance when the channel conditions are less noisy. The scalar value is static in some embodiments, and is dynamically adjusted in other embodiments to respond to channel noise conditions.

The resulting noise component represents noise derived from the digital samples (i.e., noise derived from X samples). The noise component is averaged across a sliding window to yield an average noise component (block 442). In some embodiments, the length of the sliding window is programmable, while in other cases it is fixed. The average noise component is subtracted from the X samples to yield a noise corrected output (block 444).

Turning to FIG. 4b and following flow diagram 450, the noise corrected output is equalized to yield an equalized output (block 452). The equalization may be performed, for example, in a digital finite impulse response filter. The equalized output is buffered (block 454). It is determined whether a data detector circuit is available (block 456) in parallel to a data decoding process of FIG. 4c. The data detector circuit may be, for example, a detector that applies a Viterbi algorithm detection algorithm or a maximum a posteriori detection algorithm as are known in the art. Once the data detector circuit is available (block 456), the next equalized output is selected from the buffer for processing (block 460), and the data detection algorithm is performed on the selected equalized output to yield a detected output (block 462). The detected output is stored to a central memory (block 464) to await the availability of a data decoder circuit.

Turning to FIG. 4c and following flow diagram 466, it is determined whether a data decoder circuit is available (block 470) in parallel to the previously described data detection process of FIG. 4b. The data decoder circuit may be, for example, a low density parity check data decoder circuit as are known in the art. Where the data decoder circuit is available (block 470) the next derivative of a detected output is selected from the central memory (block 472). The derivative of the detected output may be, for example, an interleaved (shuffled) version of a detected output from the data detector circuit. A first local iteration of a data decoding algorithm is applied by the data decoder circuit to the selected detected output to yield a decoded output (block 474). It is then determined whether the decoded output converged (e.g., resulted in the originally written data as indicated by the lack of remaining unsatisfied checks) (block 476).

Where the decoded output converged (block 476), it is provided as a decoded output codeword to a hard decision output buffer (e.g., a re-ordering buffer) (block 492). It is determined whether the received output codeword is either sequential to a previously reported output codeword in which case reporting the currently received output codeword immediately would be in order, or that the currently received output codeword completes an ordered set of a number of codewords in which case reporting the completed, ordered set of codewords would be in order (block 494). Where the currently received output codeword is either sequential to a previously reported codeword or completes an ordered set of codewords (block 494), the currently received output codeword and, where applicable, other codewords forming an in order sequence of codewords are provided to a recipient as an output (block 496).

Alternatively, where the decoded output failed to converge (e.g., errors remain) (block 476), it is determined whether the number of local iterations already applied equals the maximum number of local iterations (block 480). In some cases, a default seven local iterations are allowed per each global iteration. Based upon the disclosure provided herein, one of ordinary skill in the art will recognize another default number of local iterations that may be used in relation to different embodiments of the present invention. Where another local iteration is allowed (block 480), the data decoding algorithm is applied to the selected data set using the decoded output as a guide to update the decoded output (block 482). The processes of blocks starting at block 476 are repeated for the next local iteration.

Alternatively, where all of the local iterations have occurred (block 480), it is determined whether all of the global iterations have been applied to the currently processing data set (block 484). Where the number of global iterations has not completed (block 484), the decoded output is stored to the central queue memory circuit to await the next global iteration (block 486). Alternatively, where the number of global iterations has completed (block 484), an error is indicated and the data set is identified as non-converging (block 490).

It should be noted that the various blocks discussed in the above application may be implemented in integrated circuits along with other functionality. Such integrated circuits may include all of the functions of a given block, system or circuit, or a subset of the block, system or circuit. Further, elements of the blocks, systems or circuits may be implemented across multiple integrated circuits. Such integrated circuits may be any type of integrated circuit known in the art including, but are not limited to, a monolithic integrated circuit, a flip chip integrated circuit, a multichip module integrated circuit, and/or a mixed signal integrated circuit. It should also be noted that various functions of the blocks, systems or circuits discussed herein may be implemented in either software or firmware. In some such cases, the entire system, block or circuit may be implemented using its software or firmware equivalent. In other cases, the one part of a given system, block or circuit may be implemented in software or firmware, while other parts are implemented in hardware.

In conclusion, the present invention provides novel systems, devices, methods and arrangements for data processing with X sample based noise cancellation. While detailed descriptions of one or more embodiments of the invention have been given above, various alternatives, modifications, and equivalents will be apparent to those skilled in the art without varying from the spirit of the invention. Therefore, the above description should not be taken as limiting the scope of the invention, which is defined by the appended claims.

What is claimed is:

1. A data processing system comprising:
   an analog to digital converter circuit configured to convert an input signal into a series of corresponding digital samples;
   a sample based noise cancellation circuit configured to:
      calculate a noise component based at least in part on the series of digital samples; and
      subtract the noise component from the series of digital samples to yield a noise corrected output, wherein the sample based noise cancellation circuit comprises a convolution filter circuit configured to generate an approximation of the series of digital samples, and a summation circuit configured to subtract the approximation of the series of digital samples from the series of digital samples to yield a sum, wherein the noise component is derived from the sum; and
   an equalizer circuit configured to equalize the noise corrected output to yield an equalized output.

2. The data processing system of claim 1, further comprising:

a data detector circuit configured to apply a data detection algorithm to the equalized output to yield a detected output; and a data decoder circuit configured to apply a data decoding algorithm to a decoder input derived from the detected output to yield a decoded output.

3. The data processing system of claim 2, wherein the data decoder circuit comprises a low density parity check decoder circuit.

4. The data processing system of claim 2, wherein the data decoder circuit is selected from a group consisting of: a maximum a posteriori data detector circuit, and a Viterbi algorithm data detector circuit.

5. The data processing system of claim 1, wherein the sample based noise cancellation circuit further comprises a multiplier circuit configured to multiply the sum by a scalar value, wherein the noise component is derived from an output of the multiplier circuit.

6. The data processing system of claim 5, wherein the noise component comprises an average noise component, and wherein the sample based noise cancellation circuit further comprises an average error calculation circuit configured to average the output of the multiplier circuit to yield the noise component.

7. The data processing system of claim 6, wherein the average error calculation circuit is configured to average the output of the multiplier circuit across a sliding window in the series of digital samples.

8. The data processing system of claim 1, wherein the sample based noise cancellation circuit further comprises a loop detector circuit configured to generate a loop output based at least in part on the series of digital samples.

9. The data processing system of claim 8, wherein the convolution filter circuit is configured to generate the approximation of the series of digital samples by convolving the loop output with a partial response target.

10. The data processing system of claim 9, further comprising a selector configured to select between the loop output and a known data input, wherein the convolution filter circuit is configured to generate the approximation of the series of digital samples by convolving an output of the selector with a partial response target.

11. The data processing system of claim 1, wherein the sample based noise cancellation circuit further comprises a loop pulse estimation circuit configured to generate a partial response target for the convolution filter circuit based at least in part on the series of digital samples.

12. The data processing system of claim 1, wherein the system is implemented as an integrated circuit.

13. The data processing system of claim 1, wherein the data processing system is implemented as part of a device selected from a group consisting of: a data storage device, and a data communication device.

14. A method for data processing, comprising:
converting an analog signal into a series of corresponding digital samples;
calculating a noise component based at least in part on the series of digital samples, comprising generating an approximation of the series of digital samples, subtracting the approximation of the series of digital samples from the series of digital samples to yield a sum, and multiplying the sum by a scaling factor to yield the noise component;
subtracting the noise component from the series of digital samples to yield a noise corrected output; and
equalizing the noise corrected output to yield an equalized output.

15. The method of claim 14, wherein calculating the noise component further comprises averaging the result of the multiplying over an error window to yield the noise component.

16. A storage device, comprising:
a storage medium;
a head assembly disposed in relation to the storage medium and configured to provide a sensed signal corresponding to a data set on the storage medium; and
a read channel circuit including:
an analog to digital converter circuit configured to convert the sensed signal into a series of corresponding digital samples;
a sample based noise cancellation circuit configured to:
calculate a noise component based at least in part on the series of digital samples; and
subtract the noise component from the series of digital samples to yield a noise corrected output, wherein the sample based noise cancellation circuit comprises a convolution filter circuit configured to generate an approximation of the series of digital samples, and a summation circuit configured to subtract the approximation of the series of digital samples from the series of digital samples to yield a sum, wherein the noise component is derived from the sum; and
an equalizer circuit configured to equalize the noise corrected output to yield an equalized output.

17. The storage device of claim 16, wherein the read channel further comprises:
a data detector circuit configured to apply a data detection algorithm to the equalized output to yield a detected output; and
a data decoder circuit configured to apply a data decoding algorithm to a decoder input derived from the detected output to yield a decoded output.

18. The method of claim 14, wherein calculating the noise component comprises generating an approximation of the series of digital samples in a convolution filter circuit; and
subtracting the approximation of the series of digital samples from the series of digital samples to yield a sum, wherein the noise component is derived from the sum.

19. The storage device of claim 16, wherein the noise component comprises an average noise component, and wherein the sample based noise cancellation circuit further comprises an average error calculation circuit configured to average the sum to yield the noise component.

20. The storage device of claim 19, wherein the average error calculation circuit is configured to average the sum across a sliding window in the series of digital samples.

* * * * *